US012796519B2

(12) United States Patent
Coffy et al.

(10) Patent No.: US 12,796,519 B2
(45) Date of Patent: Nov. 10, 2026

(54) ELECTRONIC DEVICE

(71) Applicant: STMicroelectronics International N.V., Geneva (CH)

(72) Inventors: Romain Coffy, Voiron (FR); David Auchere, Meylan (FR); Vipin Velayudhan, Grenoble (FR)

(73) Assignee: STMicroelectronics International N.V., Geneva (CH)

(*) Notice: Subject to any disclaimer, the term of this patent is extended or adjusted under 35 U.S.C. 154(b) by 411 days.

(21) Appl. No.: 18/601,216

(22) Filed: Mar. 11, 2024

(65) Prior Publication Data

US 2024/0321809 A1 Sep. 26, 2024

(30) Foreign Application Priority Data

Mar. 22, 2023 (FR) ........................................ 2302693

(51) Int. Cl.

| | |
|---|---|
| ***H01L 23/00*** | (2006.01) |
| ***H10W 72/00*** | (2026.01) |
| ***H10W 72/30*** | (2026.01) |
| *H10W 70/60* | (2026.01) |
| *H10W 90/00* | (2026.01) |

(52) U.S. Cl.

CPC ......... *H10W 72/30* (2026.01); *H10W 72/013* (2026.01); *H10W 70/60* (2026.01); *H10W 72/01323* (2026.01); *H10W 72/01333* (2026.01); *H10W 72/352* (2026.01); *H10W 90/734* (2026.01)

(58) Field of Classification Search

CPC ............... H10W 70/60; H10W 72/013; H10W 72/01323; H10W 72/01333; H10W 72/30; H10W 72/352; H10W 90/734

See application file for complete search history.

(56) References Cited

U.S. PATENT DOCUMENTS

| | | | | |
|---|---|---|---|---|
| 8,377,749 B1 * | 2/2013 | Patterson | H10W 44/20 438/123 |
| 2012/0256239 A1 * | 10/2012 | Herbsommer | H10W 70/041 257/288 |
| 2022/0208653 A1 * | 6/2022 | Liu | H10W 40/255 |
| 2024/0128222 A1 * | 4/2024 | Chen | H10W 70/09 |

FOREIGN PATENT DOCUMENTS

| | | |
|---|---|---|
| EP | 3319116 A1 | 5/2018 |
| JP | 06120286 A1 | 4/1994 |
| KR | 1020080086042 A | 9/2008 |

OTHER PUBLICATIONS

INPI Search Report and Written Opinion for priority application, FR Appl. 2302693, report dated Oct. 11, 2023, 9 pgs.

* cited by examiner

*Primary Examiner* — David C Spalla

(74) *Attorney, Agent, or Firm* — Crowe & Dunlevy LLC

(57) ABSTRACT

An integrated circuit chip is bonded to a support. The chip includes a first connection pad and two second connection pads. The support includes a third connection pad and two fourth connection pads. A stack layers includes first, second, and third conductive layers and insulating layers. The first, second, and third conductive layers are separated from one another by the insulating layers. The second conductive layer is positioned between the first and third conductive layers. The first and third conductive layers electrically connect the two second connection pads to the two fourth connection pads. The second conductive layer electrically connects the first connection pad to the third connection pad.

22 Claims, 9 Drawing Sheets

ELECTRONIC DEVICE

PRIORITY CLAIM

This application claims the priority benefit of French Application for Patent No. 2302693, filed on Mar. 22, 2023, the content of which is hereby incorporated by reference in its entirety to the maximum extent allowable by law.

TECHNICAL FIELD

The present disclosure generally concerns electronic devices and, in particular, devices comprising an integrated circuit chip bonded and electrically connected to a support.

BACKGROUND

Many devices comprise supports having one or a plurality of integrated circuit chips located thereon. A plurality of chips is, for example, located on each support, the support enabling to form electric connections between the different chips. Each chip is thus electrically connected to the support on which it is located. Such bonds are performed by wires (wire-bond).

However, the use of unshielded wires causes phenomena of crosstalk and of loss of integrity of the signals.

There exists a need for devices comprising a chip on a support where the electric bond between the chip and the support causes less interferences and losses.

SUMMARY

An embodiment provides a device comprising an integrated circuit chip bonded to a support, the chip comprising a first connection pad and two second connection pads, the support comprising a third connection pad and two fourth connection pads, the device comprising a stack comprising first, second, and third conductive layers and insulating layers, the first, second, and third conductive layers being separated from one another by the insulating layers, the second conductive layer being located between the first and third conductive layers, the first and third conductive layers coupling together the second and fourth pads, the second conductive layer coupling the first and third pads.

Another embodiment provides a method of manufacturing a device comprising an integrated circuit chip bonded to a support, the chip comprising a first connection pad and two second connection pads, the support comprising a third connection pad and two fourth connection pads, the method comprising the manufacturing of a stack comprising first, second, and third conductive layers and insulating layers, the first, second, and third conductive layers being separated from one another by the insulating layers, the second conductive layer being located between the first and third conductive layers, the first and third conductive layers coupling together the second and fourth pads, the second layer coupling the first and third pads.

According to an embodiment, the first and third pads are configured to receive a data signal and the second and third pads are configured to receive a reference voltage.

According to an embodiment, the reference voltage is the ground.

According to an embodiment, the plane comprising the first and third pads is located between the plane comprising one of the second pads and one of the fourth pads and a plane comprising the other second pad and the other fourth pad.

According to an embodiment, the third pad is more distant from the chip than the fourth pads.

According to an embodiment, the bottom layer of the stack is one of the fourth insulating layers.

According to an embodiment, the insulating layer located between the first and second conductive layers comprises portions not covered with the second conductive layer and the insulating layer located between the second and third conductive layers, each of said portions being at least partially covered with the third conductive layer.

According to an embodiment, the first, second, and third conductive layers are made of gold or of copper.

According to an embodiment, the top layer of the stack is one of the insulating layers.

According to an embodiment, the first and second pads are located on an upper surface of the chip and the third and fourth pads are located on an upper surface of the support.

According to an embodiment, the stack extends over a lateral surface of the chip.

According to an embodiment, the stack is formed by an additive manufacturing method.

According to an embodiment, the additive manufacturing method is one among droplet jetting or fused deposition modeling.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1A:
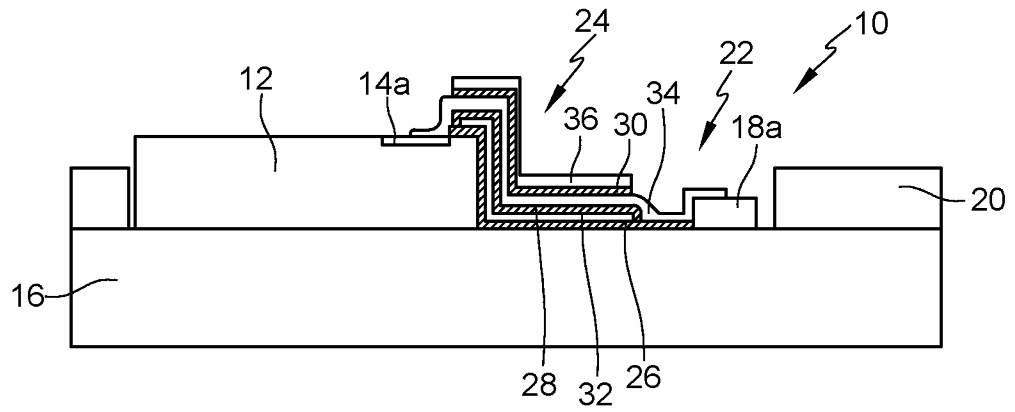
FIG. 1A, FIG. 1B, FIG. 1C, and FIG. 1D show an embodiment of an electronic device.
Figure 1B:
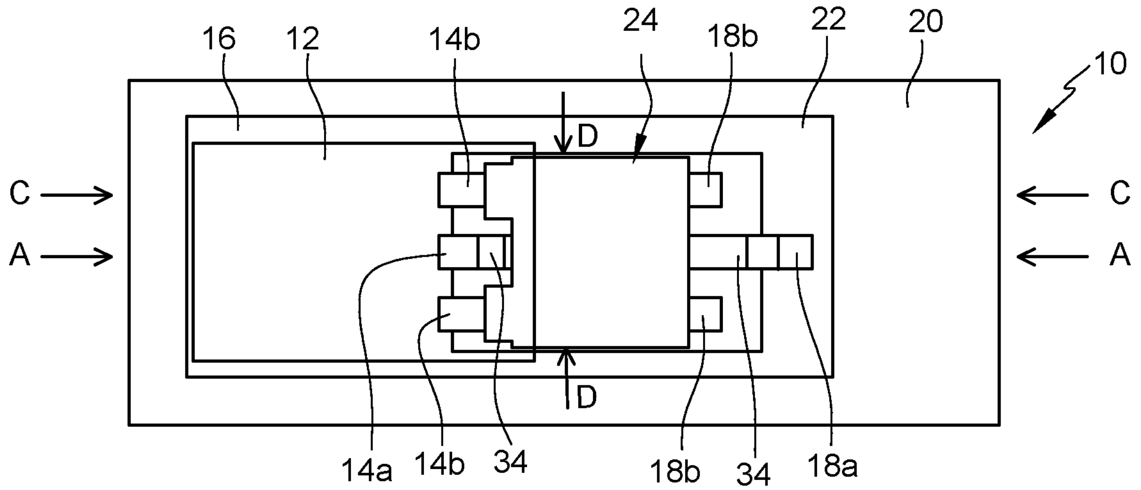
Figure 1C:
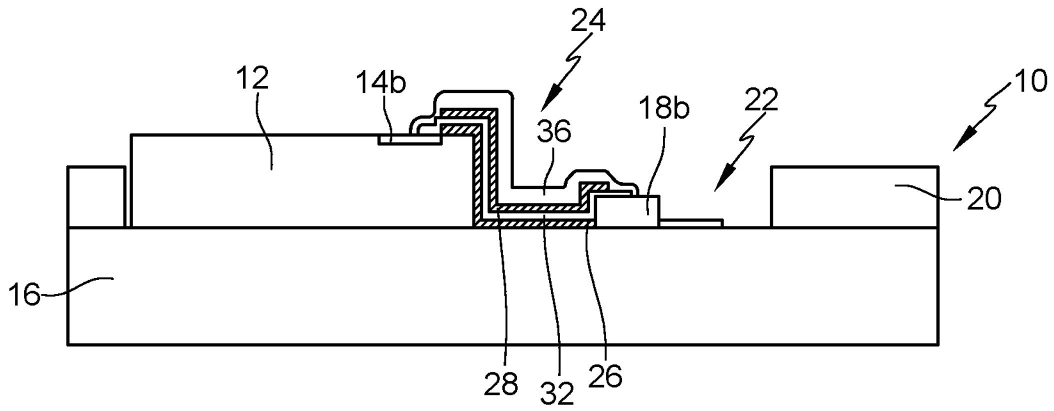
Figure 1D:
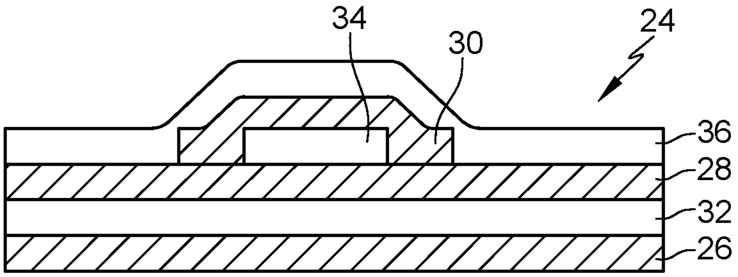

FIG. 1A, FIG. 1B, FIG. 1C, and FIG. 1D show an embodiment of an electronic device 10. More precisely, FIG. 1B shows a top view of device 10. FIG. 1A shows a cross-section view along a plane A-A of the device of FIG. 1B. FIG. 1C shows a cross-section view along a plane C-C of the device of FIG. 1B. FIG. 1D shows a cross-section view along a plane D-D of a portion of the device of FIG. 1B.

Device 10 comprises an integrated circuit chip 12 (referred to as a "chip" for short). Chip 12 comprises contact pads 14*a*, 14*b* on an upper surface. Contact pads 14*a*, 14*b* are configured to be coupled to voltage sources. More precisely, pads 14*a* are configured to receive a data signal and pads 14*b* are configured to receive a reference voltage, for example the ground.

Chip 12 is bonded to a support 16, preferably on an upper surface of support 16. Support 16 is, for example, a stack of insulating layers and of conductive layers. Support 16 is, for example, made of a laminate substrate. Support 16 is, for example, made of resin. The means for bonding chip 12 to support 16 are not shown in FIGS. 1A to 1D. Chip 12 is, for example, bonded to the support by a bonding layer, for example an adhesive layer.

Support 16 comprises, at the level of the upper surface of the support, for example on the upper surface of the support, contact pads 18*a* and 18*b*. Contact pads 18*a*, 18*b* are configured to be electrically coupled to pads 14*a*, 14*b*. Preferably, each pad 18*a*, 18*b* is electrically coupled to a pad 14*a*, 14*b*. Pads 18*a* and 18*b* are further coupled, for example by connection elements, not shown, present in the support, to voltage sources.

In the example of FIGS. 1A to 1D, the support comprises two pads 18*b* and one pad 18*a*, as well as two pads 14*b* and one pad 14*a*. Pad 18*a* is configured to transmit a data signal to the chip, more precisely to pad 14*a*. Pads 18*b* are configured to be coupled to a reference voltage, preferably the ground, and to pads 14*b*. Pads 18*a* and 18*b* are located in such a way that the plane comprising pad 18*a* and the pad 14*a* to which pad 18*a* is coupled is located between the planes each comprising one of pads 18*b* and the pad 14*b* to which said pad 18*b* is coupled.

In the example of FIGS. 1A to 1D, pads 18*b* are aligned, in other words located substantially at equal distance from chip 12. Pad 18*a* is, for example, not aligned with pads 18*b*. In other words, pad 18*a* is not located between pads 18*b*. For example, the distance between pad 18*a* and chip 12 is greater than the distance between each of pads 18*b* and chip 12. Pads 14*a*, 14*b* are, for example, aligned, as shown in FIGS. 1A to 1D. In other words, pads 14*a*, 14*b* are, for example, at equal distance from the surface of the chip closest to pads 18*a* and 18*b*.

Device 10 comprises, for example, a protection layer 20 partially covering support 16. In the example of FIGS. 1A to 1D, layer 20 partially covers the upper surface of support 16 and comprises in particular an opening 22 where chip 12 and pads 18*a* and 18*b* are located.

Device 10 comprises a stack 24 of layers. FIG. 1D shows a cross-section view of stack 24 along cross-section plane D-D. Stack 24 comprises an alternation of insulating layers 26, 28, and 30, shown with hatchings in FIGS. 1A to 1D, and of conductive layers 32, 34, 36. The conductive layers are, for example, made of metal, for example of copper or of gold. The stack comprises two conductive layers 32, 36 configured to couple pads 18*b* together and to the pads 14*b* configured to receive the reference voltage. The stack further comprises a conductive layer 34, located between the two layers 32, 36. Layer 34 is configured to couple pad 18*a* and the pad 14*a* configured to receive the data signal. The conductive layers are separated from one another by the insulating layers.

More precisely, stack 24 comprises insulating bottom layer 26. Layer 26 is the layer closest to support 16. The insulating layer 26 extends over the upper surface of support 16, over the upper surface of chip 12, and over the lateral face of chip 12 located between pads 14*a*, 14*b* and pads 18*a*, 18*b*. Preferably, layer 26 extends all the way to pads 18*a*, 18*b* and all the way to pads 14.

Stack 24 comprises conductive layer 32 partially covering layer 26. Layer 32 extends on layer 26, on pads 18*b*, and on pads 14*b*. Layer 32 is in contact with pads 14*b* and pads 18*b*. Preferably, layer 32 only rests on layer 26 and on pads 14*b*, 18*b*. Layer 32 is configured not to be in physical or electrical contact with pads 14*a* and 18*a*.

The stack comprises insulating layer 28 covering layer 32. Layer 28 for example entirely covers layer 32, pads 18*b* and 14*b* being partially exposed. Alternatively, layer 28 for example entirely covers layer 32 except for the portions of layer 32 located on pads 14*b* and 18*b*.

Stack 24 comprises conductive layer 34 partially covering layer 28. Layer 34 extends on layer 28, on pads 18*a* and 14*a*. Layer 34 is in contact with pads 14*a* and pads 18*a*. Preferably, layer 34 only rests on layer 28 and on pads 14*a*, 18*a*. Layer 34 is configured not to be in physical or electrical contact with pads 14*b* and 18*b*. Layer 34 extends over a portion of layer 28 located between other portions of layer 28. In other words, layer 28 comprises portions located on either side of the portion of layer 28 having layer 34 extending thereon.

The stack comprises insulating layer 30 covering layer 34. Layer 30 for example entirely covers layer 34. Layer 30 for example covers pads 18*b* and 14*b*. Layer 30 does not entirely cover layer 28. In other words, portions of layer 28 located on either side of layer 34 are not covered with layer 30.

The stack comprises conductive layer 36. Layer 36 preferably entirely covers layer 30. Conductive layer 36 is separated from layer 34 by layer 30. Layer 36 at least partially covers the portions of layer 28 located on either side of the portion of layer 28 having layer 34 located thereon. Layer 34 is thus surrounded with conductive layers biased to the reference voltage. In other words, the upper and lateral surfaces of layer 34 are covered with layer 36 and the lower surface of layer 34 faces layer 32.

Layer 36 is, for example, covered with an insulating layer, not shown. The insulating layer not shown is, for example, made of the same material as layers 26, 28, 30. The insulating layer not shown is, for example, a passivation layer. If layer 36 is made of copper, the insulating layer not shown is, for example, configured to avoid oxidation.

During the operation of the device, more precisely, when a signal is transmitted between the chip and the support, conductive layers 32 and 36 are biased to the reference voltage. The layer 34 on which is transmitted the data signal is thus surrounded with conductive layers biased to the reference voltage. Stack 24 thus operates as a coaxial cable. The dispersion of the signal is thus strongly limited by the conductive layers biased to the reference voltage.

FIGS. 2A, 2B, 2C, 3A, 3B, 3C, 4A, 4B, 4C, 5A, 5B, 5C, 6A, 6B, 6C, 7A, 7B, 7C, 8A, 8B, and 8C show steps, preferably successive, of a method of manufacturing the embodiment of FIGS. 1A to 1D.

During the manufacturing method, stack 24 is formed by an additive manufacturing method, that is, a method of manufacturing a structure by forming of successive layers. The layers of stack 24 are, for example, formed by droplet jetting via a method of laser melting of a carrier layer onto the receiving surface, or also by deposition of material via an extruder screw-type mechanical projection or also by vibration.

Figure 2A:
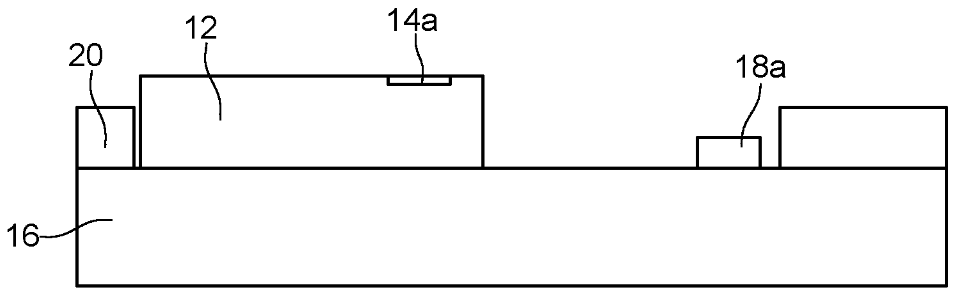
FIG. 2A, FIG. 2B, and FIG. 2C show a step of a method of manufacturing the device of FIGS. 1A to 1D.
Figure 2B:
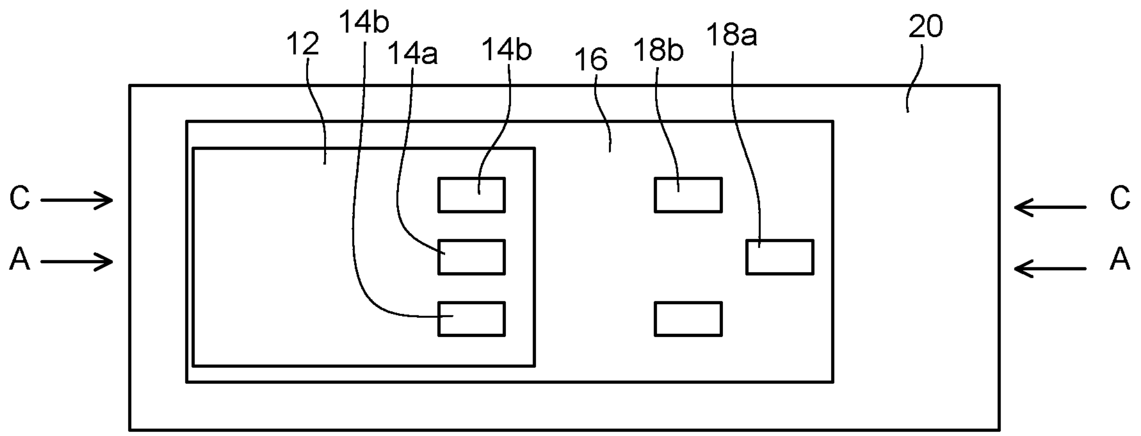
Figure 2C:
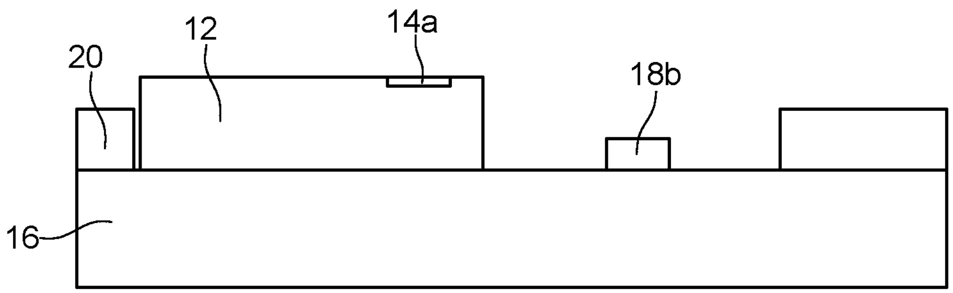

FIG. 2A, FIG. 2B, and FIG. 2C show a step of a method of manufacturing the device of FIGS. 1A to 1D. More precisely, FIG. 2B shows a top view of a structure resulting from a first step of the method of manufacturing device 10. FIG. 2A shows a cross-section view along a plane A-A of the device of FIG. 2B. FIG. 2C shows a cross-section view along a plane C-C of the device of FIG. 2B.

During this step, integrated circuit chip 12 and support 16 are formed independently. Thus, chip 12 is formed in such a way as to comprise pads 14*a* and 14*b* on an upper surface. Chip 12 comprises, for example, bonding elements on a lower surface. For example, the lower surface comprises metal pads configured to be welded or metal regions configured to support a molecular bonding. Support 16 is formed to comprise pads 18*a* and 18*b* and to couple pads 18*a* and 18*b* to means for applying voltages.

Chip 12 is then bonded to support 16. The bonding may be performed by any means, for example by application of a bonding layer, by molecular bonding, or by welding.

The step of FIGS. 2A, 2B, and 2C further comprises the forming of protection layer 20. Layer 20 partially covers the upper surface of support 16. Layer 20 does not cover the locations of pads 18*a*, 18*b*, of chip 12, and of stack 24.

Figure 3A:
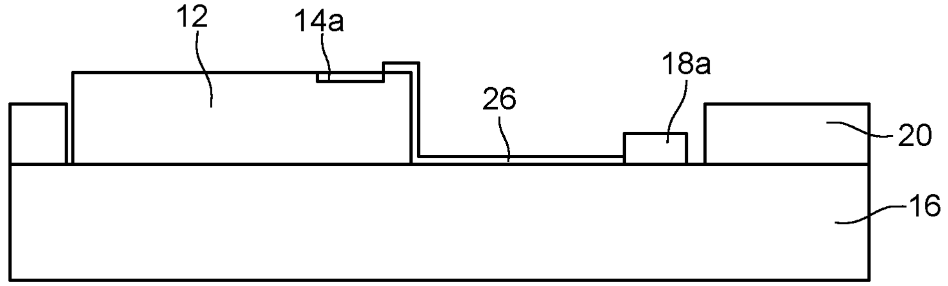
FIG. 3A, FIG. 3B, and FIG. 3C show another step of a method of manufacturing the device of FIGS. 1A to 1D.
Figure 3B:
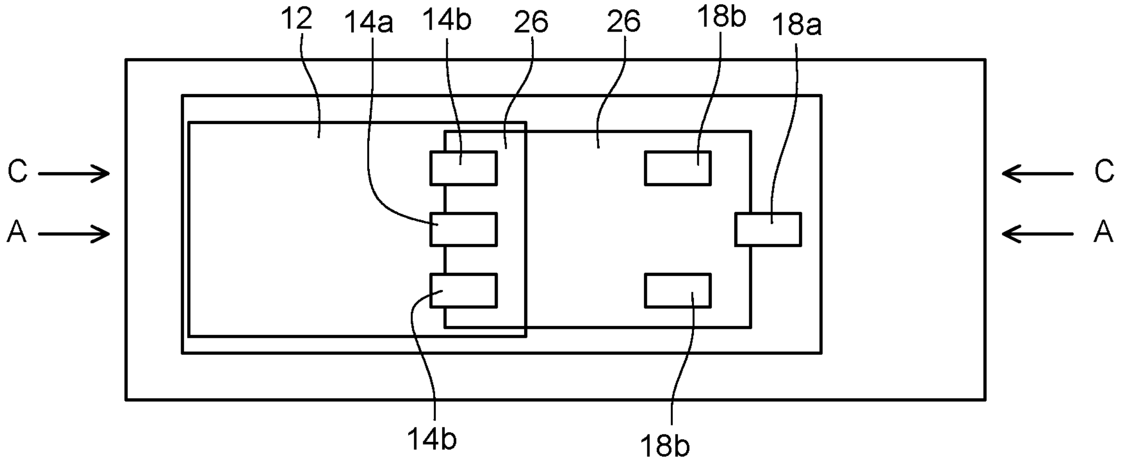
Figure 3C:
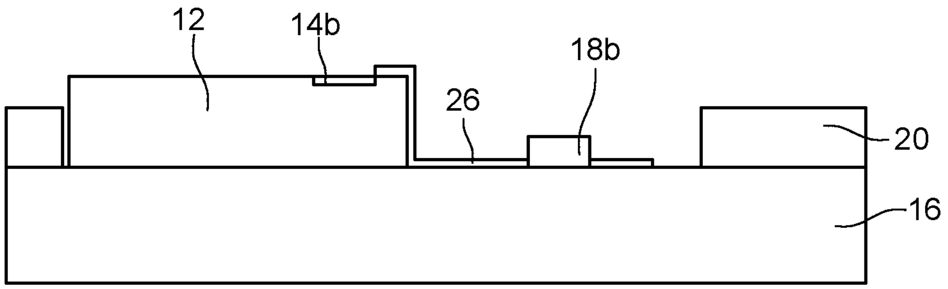

FIG. 3A, FIG. 3B, and FIG. 3C show another step of a method of manufacturing the device of FIGS. 1A to 1D. More precisely, FIG. 3B shows a top view of a structure resulting from the step of FIGS. 2A, 2B, 2C. FIG. 3A shows a cross-section view along a plane A-A of the device of FIG. 3B. FIG. 3C shows a cross-section view along a plane C-C of the device of FIG. 3B.

During this step, the bottom insulating layer 26 of stack 24 is formed on the structure resulting from the step of FIGS. 2A, 2B, and 2C.

Insulating layer 26 is, for example, the first layer formed by the additive manufacturing method. Layer 26 is, for example, formed by a droplet jetting, of inkjet type. The droplets are made of an insulating material, for example of polymer or epoxy resin.

Layer 26 covers, preferably entirely, the portion of the upper surface of support 16 located between pads 18*b* and chip 12. Layer 26 for example laterally surrounds pads 18*b*. In the example of FIGS. 2A, 2B, and 2C, layer 26 extends all the way to pad 18*a*. Layer 26 at least partially covers the lateral surface of chip 12 located between pads 14*b* and pads 18*b*. Layer 26 covers the portions of said lateral surface between pads 14*b* and pads 18*b*. Layer 26 extends all the way to pads 14*b*.

Figure 4A:
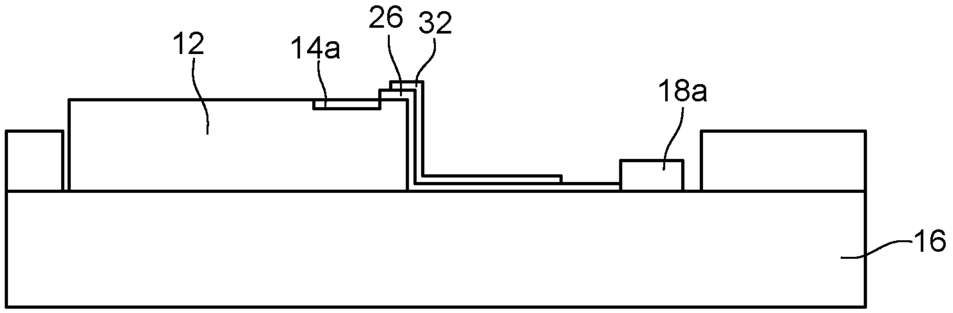
FIG. 4A, FIG. 4B, and FIG. 4C show another step of a method of manufacturing the device of FIGS. 1A to 1D.
Figure 4B:
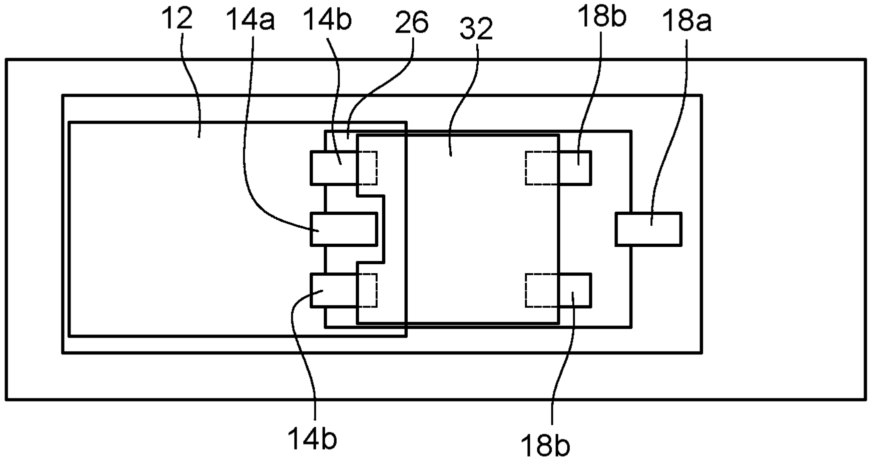
Figure 4C:
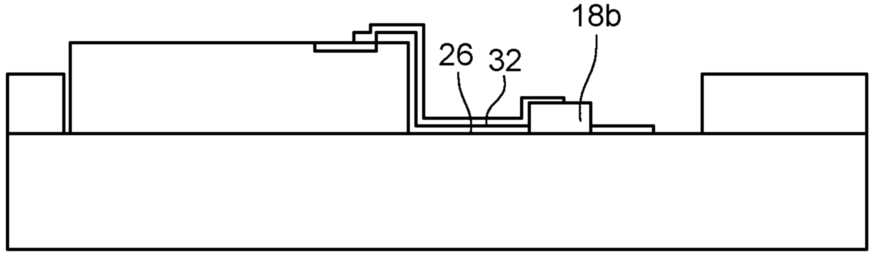

FIG. 4A, FIG. 4B, and FIG. 4C show another step of a method of manufacturing the device of FIGS. 1A to 1D. More precisely, FIG. 4B shows a top view of a structure resulting from the step of FIGS. 3A, 3B, 3C. FIG. 4A shows a cross-section view along a plane A-A of the device of FIG. 4B. FIG. 4C shows a cross-section view along a plane C-C of the device of FIG. 4B.

During this step, the first conductive layer 32 of stack 24 is formed on the structure resulting from the step of FIGS. 3A, 3B, and 3C.

Layer 32 is formed, like layer 26, by the additive manufacturing method. Layer 32 is, for example, formed by a droplet jetting, of inkjet type. Layer 32 is, for example, made of metal, for example of copper or of gold.

Layer 32 extends so as to be in contact with pads 14*b* and pads 18*b*. Layer 32 extends so as not to be in contact with pads 14*a* and 18*a*. Layer 32 preferably only extends over layer 26 and over pads 14*b* and 18*b*. Preferably, layer 32 is not in contact with the upper surface of support 16. Preferably, layer 32 is separated from the upper surface of support 16 by layer 26 and by pads 14*b* and 18*b*.

Figure 5A:
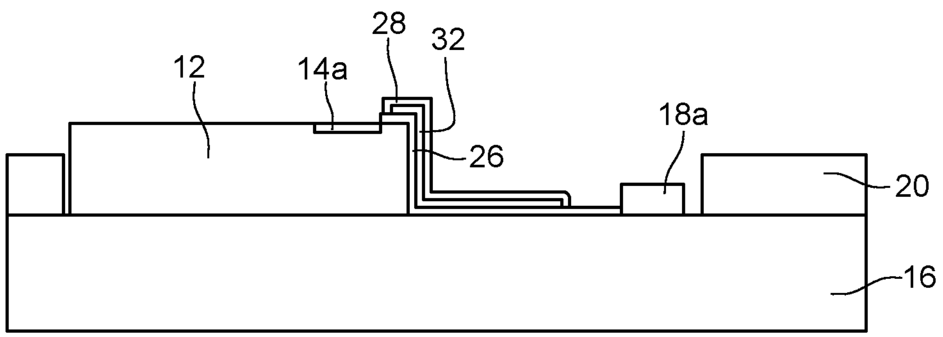
FIG. 5A, FIG. 5B, and FIG. 5C show another step of a method of manufacturing the device of FIGS. 1A to 1D.
Figure 5B:
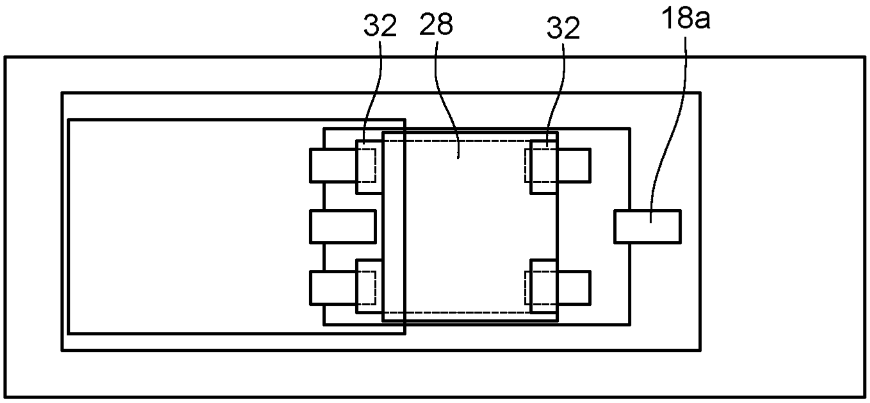
Figure 5C:
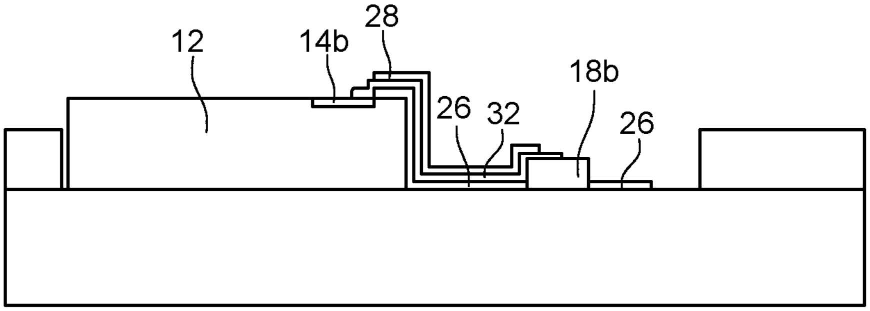

FIG. 5A, FIG. 5B, and FIG. 5C show another step of a method of manufacturing the device of FIGS. 1A to 1D. More precisely, FIG. 5B shows a top view of a structure resulting from the step of FIGS. 4A, 4B, 4C. FIG. 5A shows a cross-section view along a plane A-A of the device of FIG. 5B. FIG. 5C shows a cross-section view along a plane C-C of the device of FIG. 5B.

During this step, the insulating layer 28 of stack 24 is formed on the structure resulting from the step of FIGS. 4A, 4B, and 4C.

Layer 28 is formed, like layer 26 and layer 32, by the additive manufacturing method. Layer 28 is, for example, formed by a droplet jetting, of inkjet type. The droplets are made of an insulating material, for example of polymer or of epoxy resin.

Layer 28 covers, preferably entirely, the portion of the upper surface of layer 32 located between pads 18*b* and chip 12. Layer 28 covers, preferably entirely, the portion of the upper surface of layer 32 located between pad 18*a* and pad 14*a*.

Layer 32 preferably does not entirely cover the portion of layer 32 located on pads 14*b* and 18*b*. At least a portion of each pad 18*b*, 14*b*, or of the portion of layer 32 on said pad 18*b*, 14*b*, is not covered with layer 28. Layer 28 preferably does not cover pads 14*a* and 18*a*. Layer 28 does not entirely cover pads 14*a* and 18*a*.

Figure 6A:
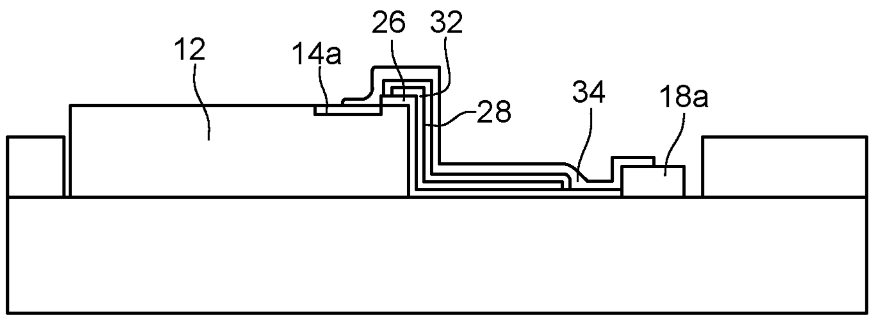
FIG. 6A, FIG. 6B, and FIG. 6C show another step of a method of manufacturing the device of FIGS. 1A to 1D.
Figure 6B:
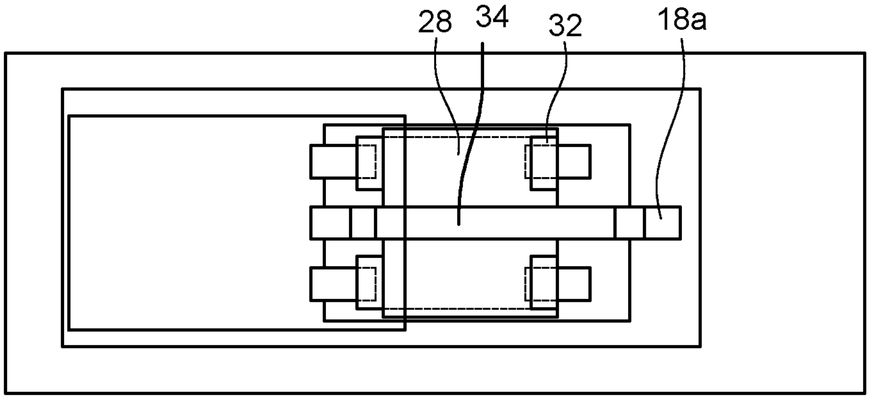
Figure 6C:
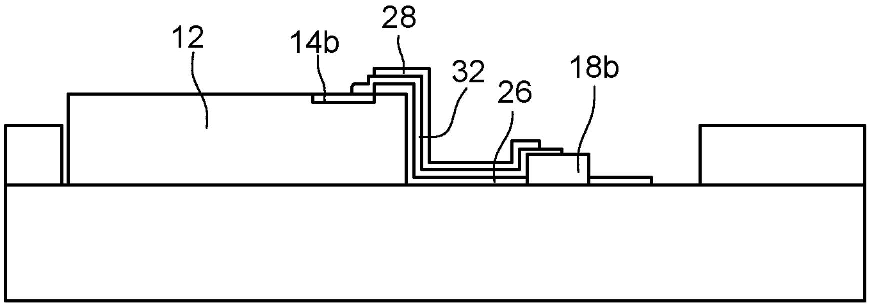

FIG. 6A, FIG. 6B, and FIG. 6C show another step of a method of manufacturing the device of FIGS. 1A to 1D. More precisely, FIG. 6B shows a top view of a structure resulting from the step of FIGS. 5A, 5B, 5C. FIG. 6A shows a cross-section view along a plane A-A of the device of FIG. 6B. FIG. 6C shows a cross-section view along a plane C-C of the device of FIG. 6B.

During this step, the second conductive layer 34 of stack 24 is formed on the structure resulting from the step of FIGS. 5A, 5B, and 5C.

Layer 34 is formed, like the other layers of stack 24, by the additive manufacturing method. Layer 34 is, for example, formed by a droplet jetting, of inkjet type. Layer 34 is for example made of metal, for example of copper or of gold.

Conductive layer 34 partially covers layer 28. Layer 34 extends over layer 28, on pads 18*a* and 14*a*. Layer 34 is in contact with pads 14*a* and pads 18*a*. Preferably, layer 34 only rests on layer 28 and on pads 14*a*, 18*a*. Layer 34 is configured so as not to be in physical or electrical contact with pads 14*b* and 18*b*. Layer 34 extends over a portion of layer 28 located between other portions of layer 28. In other words, layer 28 comprises portions located on either side of the portion of layer 28 having layer 34 extending thereon.

Figure 7A:
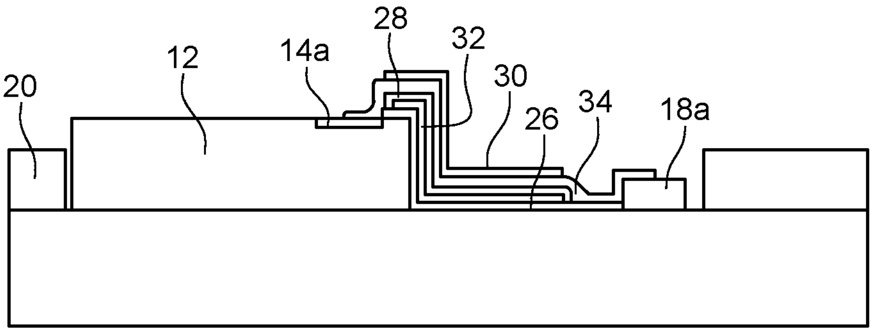
FIG. 7A, FIG. 7B, and FIG. 7C show another step of a method of manufacturing the device of FIGS. 1A to 1D.
Figure 7B:
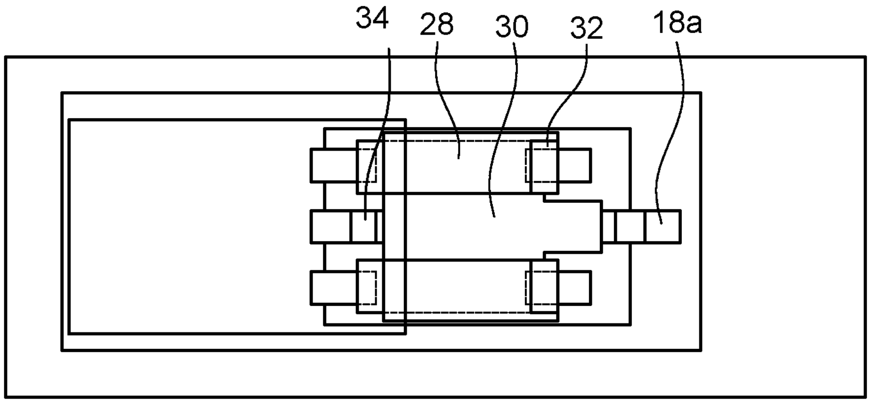
Figure 7C:
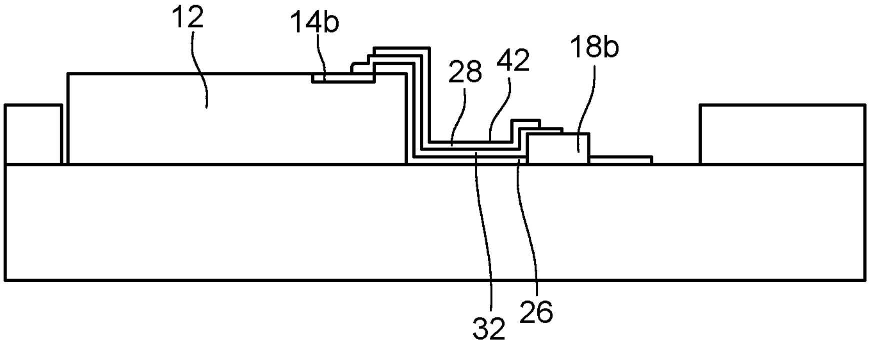

FIG. 7A, FIG. 7B, and FIG. 7C show another step of a method of manufacturing the device of FIGS. 1A to 1D. More precisely, FIG. 7B shows a top view of a structure resulting from the step of FIGS. 6A, 6B, 6C. FIG. 7A shows a cross-section view along a plane A-A of the device of FIG. 7B. FIG. 7C shows a cross-section view along a plane C-C of the device of FIG. 7B.

During this step, the insulating layer 30 of stack 24 is formed on the structure resulting from the step of FIGS. 6A, 6B, and 6C.

Layer 30 is formed, like the other layers of stack 24, by the additive manufacturing method. Layer 28 is, for example, formed by a droplet jetting, of inkjet type. The droplets are made of an insulating material, for example of polymer or of epoxy resin.

Layer 30 for example entirely covers layer 34. In the example of FIGS. 7A to 7C, layer 30 entirely covers the portions of layer 34 located between the plane of pads 14*b* and the plane of pads 18*b*. Layer 30 for example covers pads 18*b* and 14*b*. Layer 30 does not entirely cover layer 28. In other words, portions 42 of layer 28 located on either side of layer 34 are not covered with layer 30.

Figure 8A:
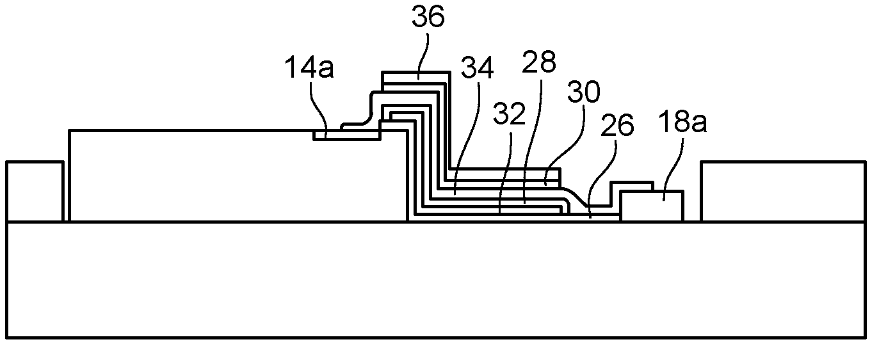
FIG. 8A, FIG. 8B, and FIG. 8C show another step of a method of manufacturing the device of FIGS. 1A to 1D.
Figure 8B:
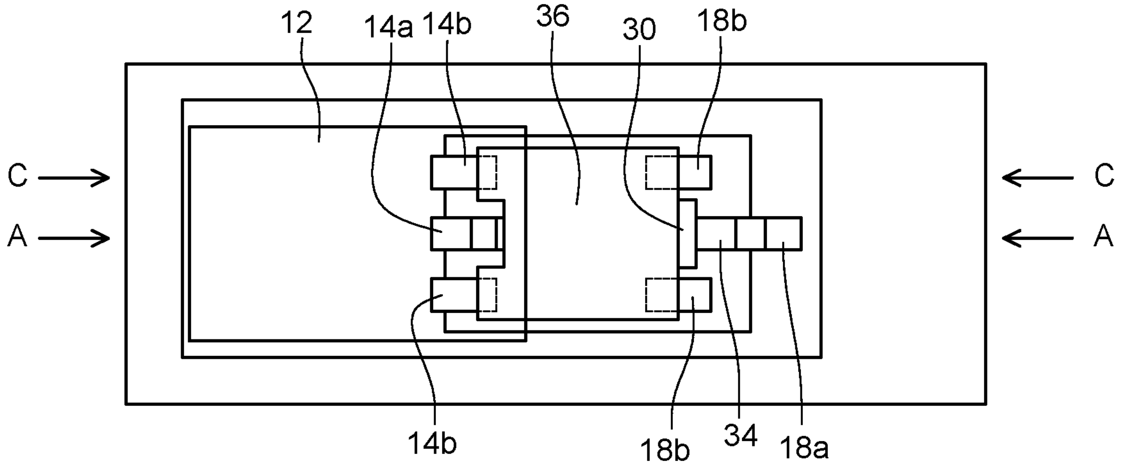
Figure 8C:
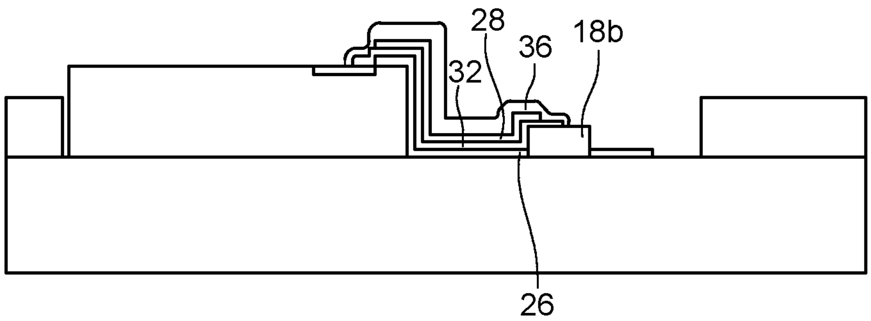

FIG. 8A, FIG. 8B, and FIG. 8C show another step of a method of manufacturing the device of FIGS. 1A to 1D. More precisely, FIG. 8B shows a top view of a structure resulting from the step of FIGS. 7A, 7B, 7C. FIG. 8A shows a cross-section view along a plane A-A of the device of FIG. 8B. FIG. 8C shows a cross-section view along a plane C-C of the device of FIG. 8B.

During this step, the third conductive layer 36 of stack 24 is formed on the structure resulting from the step of FIGS. 7A, 7B, and 7C.

Layer 36 is formed, like the other layer of stack 24, by the additive manufacturing method. Layer 36 is, for example, formed by a droplet jetting, of inkjet type. Layer 36 is, for example, made of metal, for example of copper or of gold.

Layer 36 preferably entirely covers layer 30. Conductive layer 36 is separated from layer 34 by layer 30. Layer 36 at least partially covers the portions 42 of layer 28 located on either side of the portion of layer 28 having layer 34 located thereon. Layer 34 is thus surrounded with conductive layers biased to the reference voltage, for example the ground. In other words, the upper and lateral surfaces of layer 34 are covered with layer 36 and the lower surface of layer 34 faces layer 32.

The method comprises, for example, the forming of an insulating layer not shown covering layer 36. The insulating layer not shown, for example, is made of the same material as layers 26, 28, 30. The insulating layer not shown is for example a passivation layer. If layer 36 is made of copper, the insulating layer, not shown, is for example configured to avoid oxidation.

An advantage of the previously-described embodiments is that the transmitted signal is less dispersed, in particular as compared with a wire bonding.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A device, comprising:

an integrated circuit chip bonded to a support, said integrated circuit chip including a first connection pad and two second connection pads;

wherein the support comprises a third connection pad and two fourth connection pads;

a stack of layers comprising first, second, and third conductive layers and insulating layers, the first, second, and third conductive layers being separated from one another by the insulating layers, the second conductive layer being located between the first and third conductive layers, the first and third conductive layers electrically coupling the two second connection pads to the two fourth connection pads, and the second conductive layer electrically coupling the first connection pad to the third connection pad.

2. The device according to claim 1, wherein the first connection pad and third connection pad are configured to receive a data signal and wherein the two second connection pads and two fourth connection pads are configured to receive a reference voltage.

3. The device according to claim 2, wherein the reference voltage is the ground.

4. The device according to claim 1, wherein a first vertical plane comprising the first connection pad and third connection pad is located between a second vertical plane and a third vertical plane, wherein the second vertical plane comprises one of the two second connection pads and one of the two fourth connection pads and wherein the third vertical plane comprises the other of the two second connection pads and the other of the two fourth connection pads.

5. The device according to claim 1, wherein the third connection pad is more distant from the integrated circuit chip than the two fourth connection pads.

6. The device according to claim 1, wherein a bottom layer of the stack of layers comprises one of the insulating layers.

7. The device according to claim 1, wherein the insulating layer located between the first and second conductive layers comprises portions not covered with the second conductive layer and the insulating layer located between the second and third conductive layers, and wherein said portions are at least partially covered with the third conductive layer.

8. The device according to claim 1, wherein the first, second, and third conductive layers are made of gold or copper.

9. The device according to claim 1, wherein a top layer of the stack of layer comprises one of the insulating layers.

10. The device according to claim 1, wherein the first connection pad and the two second connection pads are located on an upper surface of the integrated circuit chip and wherein the third connection pad and the two fourth connection pads are located on an upper surface of the support.

11. The device according to claim 1, wherein all conductive layers and insulating layers in the stack of layers extend over a lateral surface of the integrated circuit chip.

12. A method of manufacturing a device, comprising:

bonding an integrated circuit chip to a support, said integrated circuit chip including a first connection pad and two second connection pads;

wherein the support comprises a third connection pad and two fourth connection pads;

forming a first conductive layer electrically connecting the two second connection pads to the two fourth connection pads;

forming a first insulating layer on the first conductive layer;

forming a second conductive layer on the first insulating layer, said second conductive layer electrically connecting the first connection pad to the third connection pad;

forming a second insulating layer on the second conductive layer; and forming a third conductive layer on the second insulating layer, said third conductive layer electrically connecting the two second connection pads to the two fourth connection pads.

13. The method of claim 12, wherein forming each of the first, second, and third conductive layers and forming each of the first and second insulating layers comprises performing a droplet jetting process.

14. The method of claim 12, wherein forming each of the first, second, and third conductive layers and forming the first and second insulating layers is comprises performing a fused deposition modeling process.

15. The method according to claim 12, wherein the first connection pad and third connection pad are configured to receive a data signal and wherein the two second connection pads and two fourth connection pads are configured to receive a reference voltage.

16. The method according to claim 15, wherein the reference voltage is the ground.

17. The method according to claim 12, further comprising, before forming a first conductive layer, forming a bottom insulating layer on the integrated circuit chip and support, wherein the first conductive layer is formed on the bottom insulating layer.

18. The method according to claim 12, wherein the first insulating layer located between the first and second conductive layers comprises portions not covered with the second conductive layer and the second insulating layer located between the second and third conductive layers, and wherein said portions are at least partially covered with the third conductive layer.

19. The method according to claim 12, wherein the first, second, and third conductive layers are made of gold or of copper.

20. The method according to claim 12, further comprising forming a top insulating layer on the third conductive layer.

21. The method according to claim 12, wherein the first connection pad and the two second connection pads are located on an upper surface of the integrated circuit chip and wherein the third connection pad and the two fourth connection pads are located on an upper surface of the support.

22. The method according to claim 12, wherein forming the first, second, and third conductive layers and forming the first and second insulating layers comprises extending layers of the stack of layers over a lateral surface of the integrated circuit chip.

* * * * *